(12) United States Patent
Wang

(10) Patent No.: US 8,163,642 B1
(45) Date of Patent: Apr. 24, 2012

(54) PACKAGE SUBSTRATE WITH DUAL MATERIAL BUILD-UP LAYERS

(75) Inventor: Wen-Chou Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 372 days.

(21) Appl. No.: 12/540,262

(22) Filed: Aug. 12, 2009

Related U.S. Application Data

(62) Division of application No. 11/201,515, filed on Aug. 10, 2005, now Pat. No. 7,602,062.

(51) Int. Cl.
*H01L 21/00* (2006.01)

(52) U.S. Cl. .................... 438/612; 438/613; 438/626

(58) Field of Classification Search .......... 438/612–613, 438/626
See application file for complete search history.

(56) References Cited

U.S. PATENT DOCUMENTS

| | | | | |
|---|---|---|---|---|
| 6,346,678 B1* | 2/2002 | Kono et al. | ................... | 174/255 |
| 6,428,942 B1* | 8/2002 | Jiang et al. | ................... | 430/312 |
| 6,609,297 B1* | 8/2003 | Hiramatsu et al. | ............. | 29/852 |
| 6,740,411 B2* | 5/2004 | Kojima et al. | ................ | 428/413 |
| 6,800,169 B2 | 10/2004 | Liu et al. | | |
| 6,884,313 B2 | 4/2005 | Liu et al. | | |
| 6,888,238 B1 | 5/2005 | Li | | |
| 6,903,464 B2* | 6/2005 | Corisis | .......................... | 257/784 |
| 7,038,142 B2* | 5/2006 | Abe | .............................. | 174/255 |
| 7,041,534 B2* | 5/2006 | Chao et al. | .................... | 438/114 |
| 7,050,304 B2* | 5/2006 | Hsu et al. | ....................... | 361/719 |
| 7,087,988 B2 | 8/2006 | Hosomi | | |
| 7,089,660 B2* | 8/2006 | Hsu et al. | ........................ | 29/830 |
| 7,127,812 B2* | 10/2006 | Hiramatsu et al. | .............. | 29/852 |
| 7,151,319 B2* | 12/2006 | Iida et al. | ....................... | 257/786 |
| 7,174,631 B2 | 2/2007 | Hsu et al. | | |
| 7,178,234 B2* | 2/2007 | Kawasaki et al. | ............... | 29/852 |
| 7,224,046 B2* | 5/2007 | Abe et al. | ....................... | 257/668 |
| 7,276,800 B2* | 10/2007 | Hsu | ............................... | 257/778 |
| 7,300,822 B2 | 11/2007 | Li | | |
| 7,302,126 B2* | 11/2007 | Hsu | ................................ | 385/14 |
| 7,312,405 B2* | 12/2007 | Hsu | ............................... | 174/262 |
| 7,352,061 B2* | 4/2008 | Modi et al. | ..................... | 257/700 |
| 7,365,272 B2* | 4/2008 | Hsu et al. | ....................... | 174/250 |
| 7,378,733 B1* | 5/2008 | Hoang et al. | ................... | 257/724 |
| 7,416,972 B2* | 8/2008 | Japp et al. | ...................... | 438/624 |
| 7,416,996 B2* | 8/2008 | Japp et al. | ...................... | 438/763 |
| 7,449,781 B2* | 11/2008 | Nakai | ............................ | 257/762 |
| 7,470,990 B2* | 12/2008 | Japp et al. | ...................... | 257/762 |
| 7,508,006 B2* | 3/2009 | Hsu | ................................. | 257/98 |
| 7,518,225 B2* | 4/2009 | Emma et al. | ................... | 257/686 |

(Continued)

OTHER PUBLICATIONS

Davignon et al., "Processing High Density Boards with UV Lasers", CicuiTree, Oct. 1, 2004, pp. 1-12.

(Continued)

*Primary Examiner* — Laura Menz

(74) *Attorney, Agent, or Firm* — Weaver Austin Villeneuve & Sampson LLP

(57) ABSTRACT

Multi-layered, organic build-up semiconductor package substrates have build-up layers with layers of both fibrous organic dielectric material and non-fibrous organic dielectric material. Non-fibrous dielectric material layers are positioned below the signal metal layers and fibrous dielectric material layers are positioned below the power/ground plane metal layers. The package substrate combines in a single package substrate the advantages of rigidity, strength and relatively low CTE of a fibrous material with the capacity of a non-fibrous material to achieve fine resolution signal metal lines.

20 Claims, 3 Drawing Sheets

U.S. PATENT DOCUMENTS

| | | | |
|---|---|---|---|
| 7,519,244 B2* | 4/2009 | Hsu | 385/14 |
| 7,561,772 B2* | 7/2009 | Shtein et al. | 385/128 |
| 7,602,062 B1* | 10/2009 | Wang | 257/738 |
| 7,613,007 B2* | 11/2009 | Amey et al. | 361/763 |
| 7,621,041 B2* | 11/2009 | Banerji et al. | 29/832 |
| 7,635,641 B2* | 12/2009 | Hurwitz et al. | 438/612 |
| 7,646,098 B2* | 1/2010 | Japp et al. | 257/759 |
| 7,867,888 B2* | 1/2011 | Wang | 438/613 |
| 7,982,139 B2* | 7/2011 | Kariya et al. | 174/260 |
| 8,070,932 B2* | 12/2011 | Hsu et al. | 205/125 |
| 8,084,863 B2* | 12/2011 | Japp et al. | 257/759 |
| 2002/0129894 A1 | 9/2002 | Liu et al. | |
| 2002/0155661 A1* | 10/2002 | Massingill et al. | 438/244 |
| 2002/0161100 A1* | 10/2002 | Kojima et al. | 524/492 |
| 2003/0019568 A1 | 1/2003 | Liu et al. | |
| 2003/0136577 A1* | 7/2003 | Abe | 174/255 |
| 2004/0021210 A1 | 2/2004 | Hosomi | |
| 2004/0163248 A1 | 8/2004 | Lu et al. | 29/852 |
| 2005/0006734 A1* | 1/2005 | Harun et al. | 257/676 |
| 2005/0017357 A1* | 1/2005 | Iida et al. | 257/738 |
| 2005/0047094 A1* | 3/2005 | Hsu et al. | 361/704 |
| 2005/0218524 A1* | 10/2005 | Japp et al. | 257/762 |
| 2005/0224976 A1 | 10/2005 | Hsu et al. | |
| 2005/0236176 A1* | 10/2005 | Hsu et al. | 174/250 |
| 2005/0250252 A1 | 11/2005 | Li | |
| 2005/0284655 A1* | 12/2005 | Hsu et al. | 174/255 |
| 2006/0001152 A1 | 1/2006 | Hu | |
| 2006/0003579 A1 | 1/2006 | Sir | |
| 2006/0022341 A1 | 2/2006 | Sir et al. | |
| 2006/0049530 A1* | 3/2006 | Hsu | 257/784 |
| 2006/0073638 A1 | 4/2006 | Hsu | |
| 2006/0137905 A1* | 6/2006 | Kariya et al. | 174/255 |
| 2006/0145328 A1 | 7/2006 | Hsu | |
| 2006/0170098 A1* | 8/2006 | Hsu | 257/723 |
| 2006/0188416 A1* | 8/2006 | Alward et al. | 422/180 |
| 2006/0237854 A1* | 10/2006 | Hsu | 257/778 |
| 2006/0261464 A1 | 11/2006 | Modi et al. | |
| 2007/0006435 A1* | 1/2007 | Banerji et al. | 29/25.41 |
| 2007/0086695 A1 | 4/2007 | Hsu | |
| 2007/0086696 A1 | 4/2007 | Hsu | |
| 2007/0104412 A1 | 5/2007 | Hsu | |
| 2007/0105277 A1 | 5/2007 | Pendse et al. | |
| 2007/0130763 A1 | 6/2007 | Hsu et al. | |
| 2007/0132072 A1 | 6/2007 | Chang | |
| 2007/0141310 A1* | 6/2007 | Song et al. | 428/209 |
| 2007/0144774 A1 | 6/2007 | Hsu | |
| 2007/0158847 A1 | 7/2007 | Hsu | |
| 2007/0164438 A1 | 7/2007 | Sir et al. | |
| 2007/0182016 A1* | 8/2007 | Japp et al. | 257/762 |
| 2007/0210423 A1 | 9/2007 | Hsu | |
| 2007/0216019 A1 | 9/2007 | Hsu | |
| 2007/0241464 A1 | 10/2007 | Pendse et al. | |
| 2007/0261234 A1 | 11/2007 | Song et al. | |
| 2007/0262441 A1* | 11/2007 | Chen | 257/706 |
| 2007/0290315 A1* | 12/2007 | Emma et al. | 257/686 |
| 2008/0011507 A1* | 1/2008 | Vasoya | 174/260 |
| 2008/0029894 A1* | 2/2008 | Wang | 257/762 |
| 2008/0030965 A1 | 2/2008 | Lien et al. | |
| 2008/0041621 A1* | 2/2008 | Hsu et al. | 174/262 |
| 2008/0054446 A1* | 3/2008 | Modi et al. | 257/700 |
| 2008/0057630 A1* | 3/2008 | Modi et al. | 438/125 |
| 2008/0060838 A1 | 3/2008 | Chen et al. | |
| 2008/0075836 A1 | 3/2008 | Chen et al. | |
| 2008/0078570 A1* | 4/2008 | Japp et al. | 174/256 |
| 2008/0083560 A1* | 4/2008 | Saiki et al. | 174/255 |
| 2008/0116562 A1 | 5/2008 | Lien et al. | |
| 2008/0164597 A1 | 7/2008 | Hsu et al. | |
| 2008/0166497 A1* | 7/2008 | Hsu et al. | 427/552 |
| 2008/0184555 A1* | 8/2008 | Machida | 29/830 |
| 2008/0185704 A1 | 8/2008 | Hsu et al. | |
| 2008/0191353 A1* | 8/2008 | Japp et al. | 257/759 |
| 2008/0191354 A1* | 8/2008 | Japp et al. | 257/759 |
| 2008/0210460 A1 | 9/2008 | Lien et al. | |
| 2008/0217739 A1* | 9/2008 | Lien et al. | 257/535 |
| 2008/0230260 A1 | 9/2008 | Shih | |
| 2008/0237884 A1 | 10/2008 | Hsu | |
| 2009/0096093 A1* | 4/2009 | Yang et al. | 257/737 |
| 2009/0096098 A1* | 4/2009 | Yang et al. | 257/738 |
| 2009/0173426 A1* | 7/2009 | Japp et al. | 156/60 |
| 2009/0175000 A1* | 7/2009 | Japp et al. | 361/679.55 |
| 2009/0200069 A1* | 8/2009 | Kariya et al. | 174/255 |
| 2009/0238233 A1* | 9/2009 | Bchir et al. | 372/50.124 |
| 2009/0250826 A1* | 10/2009 | Inomata | 257/789 |
| 2009/0258161 A1* | 10/2009 | Japp et al. | 427/555 |
| 2011/0063811 A1* | 3/2011 | Kariya et al. | 361/761 |

OTHER PUBLICATIONS

High-Density Circuit Boards, Kyocera, Apr. 7, 2006 dated printed, pp. 1-2.

Welcome to Kinsus: Products data sheets, Apr. 7, 2006 dated printed, pp. 1-2.

DNP Electronic Device—DNP Electronic Device Operations, DNP LSI Design Co., Ltd., Jul. 25, 2005 dated printed, pp. 1-4.

* cited by examiner

PACKAGE SUBSTRATE WITH DUAL MATERIAL BUILD-UP LAYERS

CROSS-REFERENCE TO RELATED APPLICATION

This application is a divisional of and claims priority from U.S. patent application Ser. No. 11/201,515, filed Aug. 10, 2005, titled "PACKAGE SUBSTRATE WITH DUAL MATERIAL BUILD-UP LAYERS," the entirety of which is incorporated herein by this reference for all purposes.

BACKGROUND OF THE INVENTION

This invention relates generally to semiconductor chip package assemblies, and in particular to organic build-up package substrates used in such packages. More specifically, the invention relates to multi-layer organic build-up package substrates having both fibrous and non fibrous dielectric layers, and to associated packages and methods of manufacture.

Multi-layered, organic build-up package substrates were developed to respond to the need for high-speed, large-scale integrated circuit assemblies. Circuits are formed on pure copper conductors, keeping resistance low. Insulation layers are formed from organic resin, such as Ajinomoto Build-up Film (ABF), providing low permittivity and enable the fine pitch line and space requirements of increasingly high bump density flip chips.

However, packages using these organic build-up substrates have had problems meeting reliability requirements. This is believed to be due to the high coefficient of thermal expansion (CTE) mismatch between the silicon-based die (about 2.6) and the organic build-up material (e.g., ABF has a CTE of about 50). The problem is exacerbated in the case of low-k dies, particularly large low-k dies, which use low-K dielectric materials. Low-k materials have very low mechanical strength compared to the traditional SiO2 dielectric films due to their porous nature, which results in lower cohesive strength and greater brittleness. Thus, low-k dies are more susceptible to cracking and/or failure under thermal expansion mismatch induced stresses than conventional dielectrics. Accordingly, improved organic build-up package substrates are needed.

SUMMARY OF THE INVENTION

To achieve the foregoing, the present invention provides a multi-layered, organic build-up package substrates having build-up layers with layers of both fibrous organic dielectric material and non-fibrous organic dielectric material. The substrate is preferably configured so that non-fibrous dielectric material layers are positioned below the signal metal layers and fibrous dielectric material layers are positioned below the power/ground plane metal layers. Such a package substrate combines in a single package substrate the advantages of rigidity, strength and relatively low CTE of a fibrous material with the capacity of a non-fibrous material to achieve fine resolution signal metal lines.

Semiconductor packages incorporating the substrates and methods for their fabrication are also provided.

These and other features and advantages of the present invention are described below.

DETAILED DESCRIPTION OF SPECIFIC EMBODIMENTS

Figure 1:
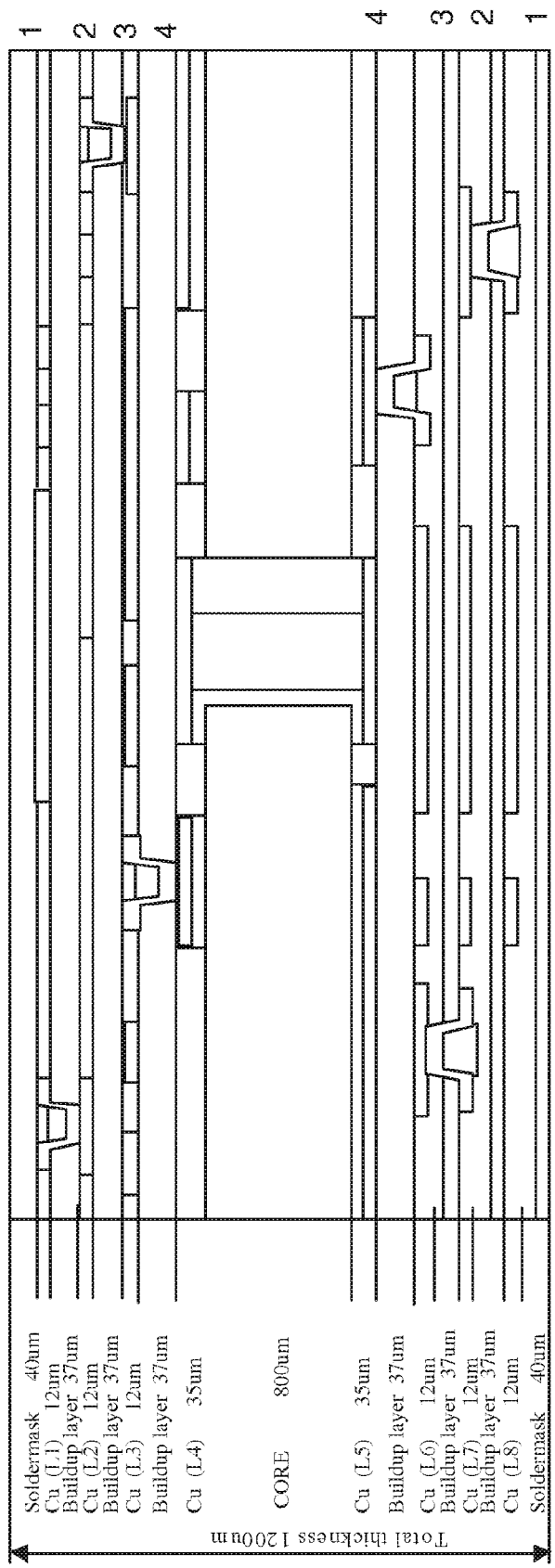
FIG. 1 illustrates a multi-layer organic build-up semiconductor package substrate in accordance with one embodiment of the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention provides multi-layered, organic build-up package substrates having build-up layers with layers of both fibrous organic dielectric material and non-fibrous organic dielectric material. The substrate is preferably configured so that non-fibrous dielectric material layers are positioned below the signal metal layers and fibrous dielectric material layers are positioned below the power/ground plane metal layers. Such a package substrate combines in a single package substrate the advantages of rigidity, strength and relatively low CTE of a fibrous material with the capacity of a non-fibrous material to achieve fine resolution signal metal lines. The substrates find particular application in flip chip ball grid array packages.

Substrate

Organic build-up package substrates are generally formed from a core circuit substrate with a build-up laminate of metal and dielectric layers on either side, as is well known in the art. The base core material is generally a fiber reinforced epoxy resin, typically bismaleimide triazine (BT) or FR-4 embedded with glass fibers. The core has internal circuitry and may have incorporated metal layers. Cores with two incorporated metal layers, one on each side, are common. Cores may also have four metal layers, or more or none at all.

The core is supplemented with a laminate of alternating layers of patterned metal, typically copper (Cu) forming signal or power/ground plane layers, and organic dielectric to electrically isolate the layers, on either side of the core. According to the present invention, multi-layered, organic build-up flip chip ball grid array package substrates have build-up layers with layers of both fibrous organic dielectric material and non-fibrous organic dielectric material.

The non-fibrous dielectric material layers (e.g., ABF) are positioned below (that is, center-ward of) the signal metal layers. These non-fibrous materials generally have embedded fillers (e.g., silica particle fillers), but no fibers. They have low modulus (e.g., about 3 to 4 GPa, for example 3.5 GPa), high CTE (e.g., about 50 to 100 ppm, for example 60 ppm) and less strength than fibrous dielectric materials, such as BT. However, seed metal (e.g., Cu) for the overlying signal metal layer is applied to these materials by electro-less plating. Metal applied in this manner is said to have "shallow teeth" into the dielectric. Because of the "shallow teeth," the seed etch used to remove the seed metal following pattern plating to prevent shorting of metal lines in the signal layer is effective such that fine resolution line/space spacing of 20/20 microns, 15/15 microns, or even 10/10 microns, can be achieved. In addition, drilling for vias may be accomplished cleanly and easily through the non-fibrous material, and smaller via diameters can be achieved, for example down to 30 microns, e.g., 40 microns.

The fibrous dielectric material layers are positioned below the power/ground plane metal layers. Fibrous dielectric material (e.g., BT) layers, have high modulus (e.g., about 20 to 25 GPa, for example 22 GPa), low CTE (e.g., about 17 to 22, for example 18.5 ppm) and greater strength than non-fibrous materials. Fibrous package substrate dielectric material, such as BT, typically has the metal (e.g., Cu) laminated to the BT. The lamination process results in the metal having "deep teeth" into the BT to provide good adhesion. Because of the "deep teeth," the seed etch cannot be well controlled to effectively remove all metal between tightly spaced lines and cannot achieve the fine resolution, e.g., at most 20/20 um line/space, desired for signal layers. Achievable spacing is, however, suitable for power/ground plane layers where fine resolution is not required. The fibrous (e.g., BT) layers in the substrate reduce the CTE and increase the rigidity and strength of the substrate as a whole which will allow it to pass more TCB cycles during reliability testing.

In a preferred embodiment, the CTE of the fibrous dielectric build-up material underlying a power/ground plane metal layer is no more than half the CTE of the non-fibrous dielectric build-up material underlying a signal metal layer, for example about a third of the non-fibrous build-up material CTE. For example, ABF (CTE of about 60) and BT (CTE of about 18.5 ppm) may be used as the non-fibrous and fibrous dielectric build-up materials in substrates in accordance with the present invention.

Thus, such a package substrate combines the advantages of rigidity, strength and relatively low CTE of a fibrous material with the capacity of a non-fibrous material for easy post-deposition processing (e.g., drilling) and to achieve fine resolution metal lines in a single package substrate.

Referring to FIG. 1, the structure of a package substrate in accordance with one embodiment of the present invention is shown. This embodiment of the invention is a 3/2/3 flip chip ball grid array (FC BGA) substrate with several build-up layers. The 3/2/3 nomenclature refers to a substrate having two core metal layers, with three layers of metal separated by build-up dielectric layers on both sides (referred to as the top and the bottom) of the core; three (3) build-up metal layers, two (2) core metal layers, and three (3) more build-up metal layers.

The top-most build-up layer 1 on each side of the core is a solder mask having a thickness of, for example, about 20 to 40, e.g., 40, microns. The solder mask 4 covers a signal metal (e.g., Cu) layer L1/L8, for example, about 12 to 15, e.g., 12, microns thick. Below the metal L1/L8 and solder mask 1 layers is another layer of build-up 2. This layer of build-up 2 is composed of a non-fibrous dielectric material, such as Ajinomoto Build-up Film (ABF) to provide a base for fine resolution signal metal lines of layers L1/L8, and is, for example, about 30 to 40, e.g., 37, microns thick.

Build-up layer 2 covers a power/ground plane metal (e.g., Cu) layer L2/L7. Below the metal L2/L7 and build-up 2 layers is another layer of build-up 3. This layer of build-up 3 is composed of a fibrous dielectric material, such as BT, FR-4 or other fibrous package substrate dielectrics, to provide low modulus and high strength for the substrate. The fibers in the material may be distributed throughout the material (BT, FR-4) or concentrated in the middle of the material layer (e.g., BT prepreg with adhesive layers on both sides).

Build-up layer 3 covers another signal metal (e.g., Cu) layer L3/L6. Below the metal L3/L6 and build-up 3 layers is another layer of build-up 4. This layer of build-up 4 is composed of a non-fibrous dielectric material, such as ABF to provide a base for fine resolution signal metal lines of metal layers L3/L6.

Below the build-up layer 4 are the metal layers L4/L5 of the core, having a thickness, for example, of about 35 microns. With a core thickness of, for example, about 800 microns, the total substrate thickness for this 3/2/3 implementation of the present invention is about 1200 microns. The noted film thicknesses are only examples for this particular embodiment and can very with different implementations, as will be apparent to one of skill in the art.

The same structure and principles can be applied to other substrate configurations, such as 3/4/3, where the core has two metal layers and three build-up metal layers on each side (soldermask/ABF/BT/ABF/Core/ABF/BT/ABF/soldermask). Other non-limiting examples include 4/4/4 (soldermask/ABF/BT/ABF/BT/Core/BT/ABF/BT/ABF/ soldermask), 5/2/5 (soldermask/ABF/BT/ABF/BT/ABF/Core/ ABF/BT/ABF/BT/ABF/ soldermask) and 5/4/5 (soldermask/ ABF/BT/ABF/BT/ABF/Core/ABF/BT/ABF/BT/ABF/ soldermask).

It should be noted that, while the signal and power/ground plane layers are often alternating, and so the non-fibrous and fibrous build-up layers associated with each of these types of metal layers in accordance with the present invention also typically alternate, this need not be the case, as long as the build-up dielectric layer are interspersed with metal layers in the multi-layer build-up as described herein.

Package

Figure 2:
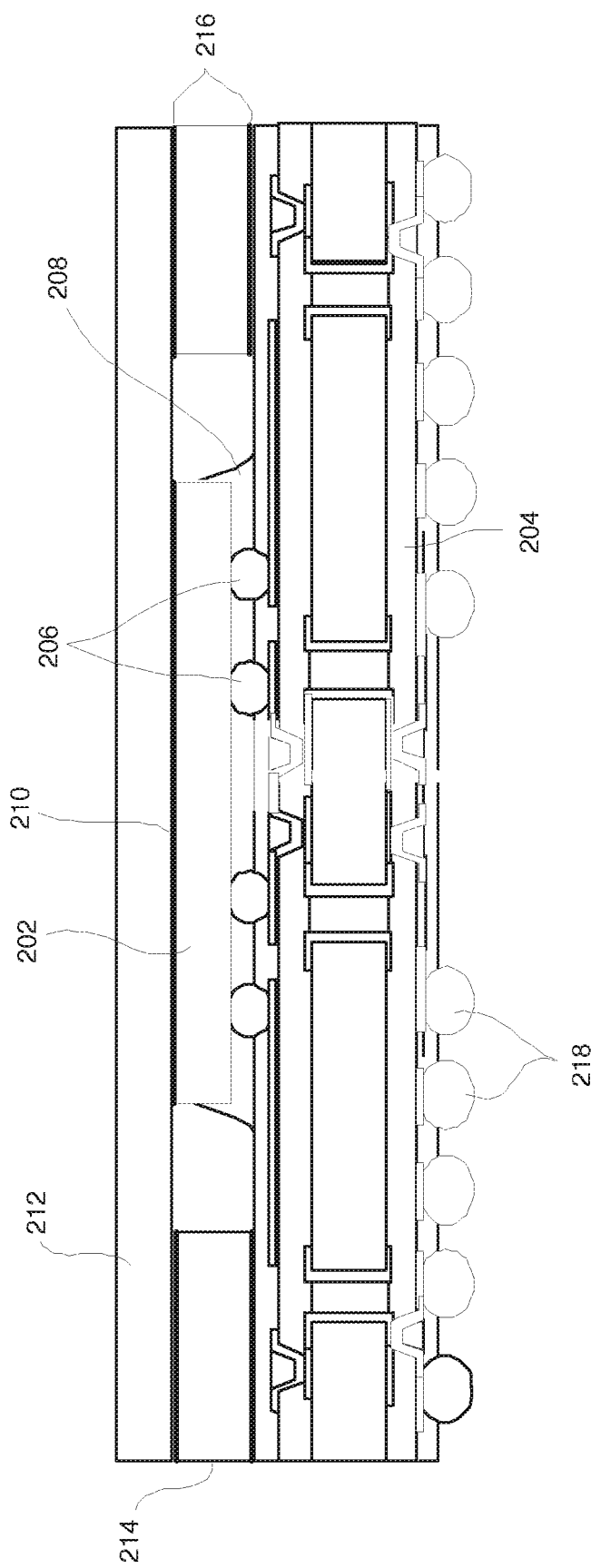
FIG. 2 illustrates a flip chip ball grid array semiconductor package incorporating a multi-layer organic build-up substrate in accordance with the present invention.

Referring to FIG. 2, a multi-layer organic build-up substrate in accordance with the present invention is shown incorporated into a flip chip BGA package in accordance with one embodiment of the present invention. The package 200 includes a flip chip die 202 bonded to a multi-layer organic build-up substrate in accordance with the present invention 204 (detail not shown) via solder bumps 206 and an underfill material 208. The flip chip die 202 is connected with a heat spreader 212 via a thermal interface material (TIM) 210. The heat spreader 212 is connected with the substrate 204 via a stiffener 214 and adhesive 216. The underside of the substrate 204 has a ball grid array (BGA) 218 for connecting the package to a printed circuit board (PCB) for use in an electronic device.

Packages in accordance with the present invention will have improved reliability and performance relative to packages using conventional build-up substrates. The substrates in accordance with the present invention provide all the necessary functions—heat dissipation, mechanical rigidity, low warpage, CTE closer to PCB, good reliability performance and good electrical performance in flip chip BGA packages at a similar cost to convention packages.

Process

Build-up substrates in accordance with the present invention may be fabricated using techniques know to those of skill in the art applied in a manner that will be clear to one skilled in the art from the present disclosure. The process begins with the application of a build-up dielectric layer to each side of a core. Either a fibrous or a non-fibrous dielectric may be initially applied to the core. The appropriate metal layer is then formed on the dielectric; signal metal layer for non-fibrous dielectric and power/ground plane metal layer for fibrous dielectric. Then another layer of dielectric is applied and the appropriate metal layer formed. A substrate in accordance with the present invention has at least one layer of fibrous dielectric and associated power/ground plane metal layer, and one layer of non-fibrous dielectric and associated signal metal layer. Of course, additional dielectric and metal layers may be included. The layers of fibrous and non-fibrous dielectric layers and associated metal layers may, but need not, alternate.

Figure 3:
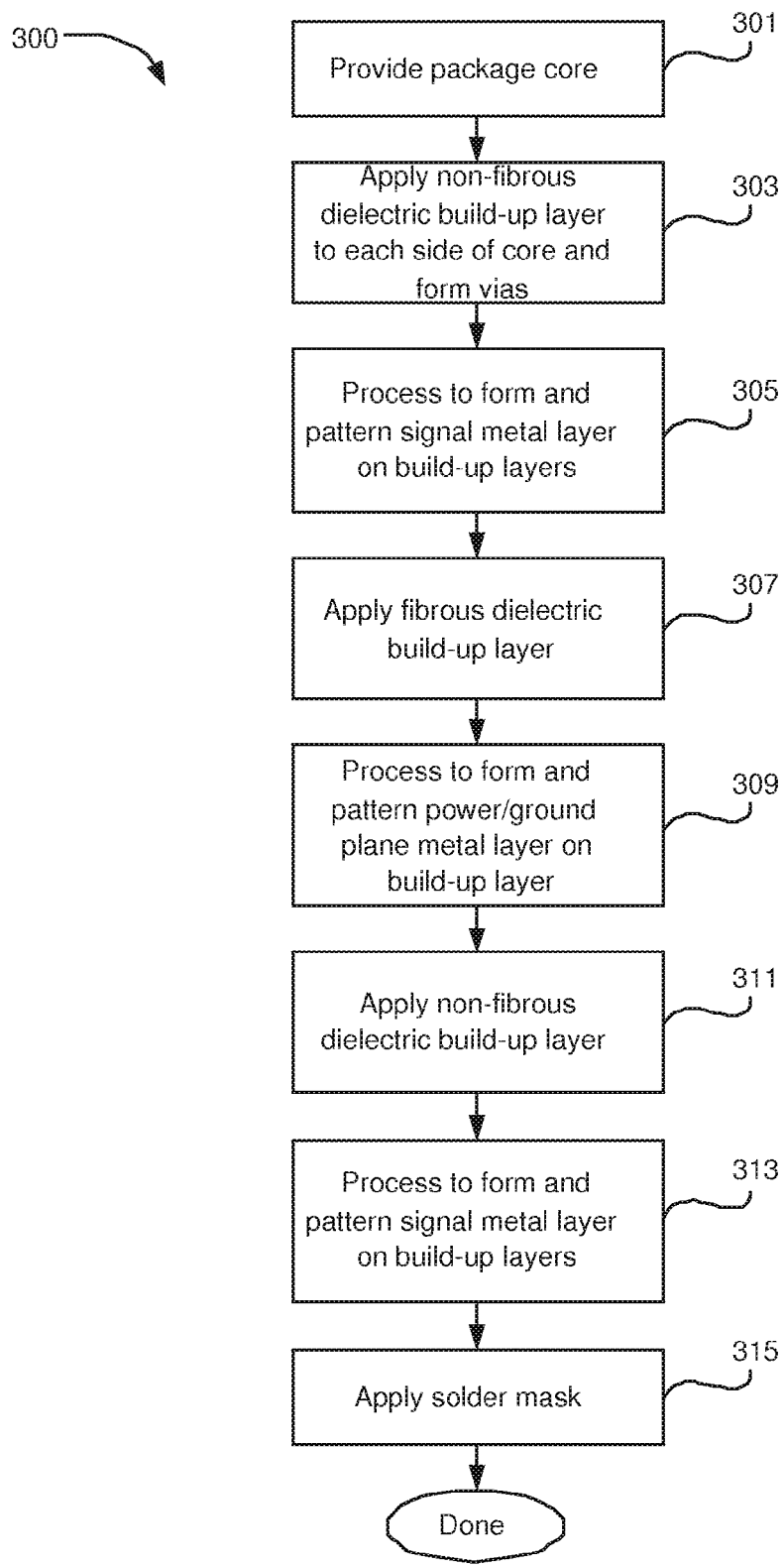
FIG. 3 is a process flow diagram showing a multi-layer organic build-up semiconductor package substrate fabrication technique in accordance with the present invention.

FIG. 3 depicts a process flow for key operations in the fabrication of a multi-layer organic build-up substrate in accordance with one embodiment of the present invention, such as depicted in FIG. 1. The process flow 300 begins with the provision of a package substrate core (301). The core is typically composed of a fibrous organic material for strength and has internal circuitry and any desired number of metal layers. To each side of the core is applied a first dielectric build-up layer (303). As noted above, the first dielectric build-up layer may be fibrous or non-fibrous. In this embodiment, the first dielectric build-up layer is non-fibrous, such as ABF. Vias are formed in the applied dielectric build-up layer (303). In general, via holes are drilled, by laser, through the build-up dielectric. Processing is then conducted to form and pattern a signal metal layer (305). An electro-less copper seed layer is applied to the build-up dielectric, and signal lines are then formed by semi-additive processing by photolithography and electroplating. Then the seed is etched away to isolate the lines.

Next, a fibrous dielectric build-up layer, such as BT, is applied (307) and processed to form and pattern a power/ground plane metal layer (309). In general, the fibrous build-up layer has a copper layer laminated to its surface. The layer is processed by conventional techniques (e.g., wet etch) or any other suitable technique to form a power/ground plane.

All or some of the build-up processing (303-309) is then optionally repeated as necessary to form the desired number and configuration of build-up layers. Also, as noted above, the order of 303-309 may be rearranged so that the fibrous build-up dielectric is initially applied to the core. In this particular embodiment, having an initially deposited non-fibrous dielectric and a second signal metal layer, another non-fibrous dielectric build-up layer is applied (311) and processed to form a second signal metal layer (313). Once the desired number of build-up layers has been formed, a solder mask is applied to complete the substrate (315).

No new equipment or individual process step techniques are needed for the assembly process flow, since the individual steps are performed in conventional organic build-up substrate fabrication. The combination of steps to form the multi-layer substrate with both fibrous and non-fibrous build-up layers provides a new process to form the substrates of the present invention. The process flow should have large process window for via drilling and signal pattern formation.

CONCLUSION

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A method of making a package substrate, comprising:
   providing a substrate core;
   applying one of a non-fibrous or a fibrous build-up dielectric layer to the core;
   forming a first metal layer on the build-up dielectric layer;
   applying the other of the non-fibrous or fibrous build-up dielectric layer over the metal layer; and
   forming a second metal layer on the other build-up dielectric layer;
   wherein the non-fibrous dielectric underlies a signal metal layer and the fibrous dielectric underlies a power/ground plane metal layer.

2. The method of claim 1, wherein the build-up dielectric applied to the core is non-fibrous and the first metal layer is a signal metal layer.

3. The method of claim 2, wherein the other build-up dielectric is fibrous and the second metal layer is a power/ground plane metal layer.

4. The method of claim 3, further comprising applying and forming one or more additional dielectric and metal build-up layers to the core, wherein non-fibrous dielectric underlies signal metal layers and fibrous dielectric underlies power/ground plane metal layers.

5. The method of claim 4, further comprising a solder mask on the top-most metal layer.

6. The method of claim 1, wherein the substrate core has a first surface and a second surface opposite the first surface and an equal number of build-up layers on both surfaces of the core layer.

7. The method of claim 1, wherein the non-fibrous build-up layer comprises a silica-particle filled epoxy resin.

8. The method of claim 1, wherein the fibrous build-up layer comprises a glass fiber reinforced epoxy resin.

9. The method of claim 8, wherein the epoxy resin is bismaleimide triazine.

10. The method of claim 1, wherein the CTE of the fibrous build-up layer is no more than half the CTE of the non-fibrous build-up layer.

11. The method of claim 6, wherein the core has two metal layers and the build-up layers on each surface of the core have three metal layers each.

12. The method of claim 1, wherein each of the build-up dielectric layers has a thickness that is substantially less than the thickness of the core layer.

13. The method of claim 1, wherein each of the build-up dielectric layers has a thickness that is about 5% of the thickness of the core layer.

14. A method of making a package substrate, comprising:
   providing a substrate core; and
   applying a plurality of build-up dielectric layers on a first surface of the core layer comprising
   a layer of fibrous organic dielectric material underlying a power/ground metal layer and a layer of non-fibrous organic dielectric material underlying a signal metal layer.

15. The method of claim 14, further comprising applying and forming one or more additional dielectric and metal build-up layers to the core, wherein non-fibrous dielectric underlies signal metal layers and fibrous dielectric underlies power/ground plane metal layers.

16. The method of claim 15, further comprising a solder mask on the top-most metal layer.

17. The method of claim 14, wherein the substrate core has a first surface and a second surface opposite the first surface and an equal number of build-up layers on both surfaces of the core layer.

18. The method of claim 14, wherein the non-fibrous build-up layer comprises a silica-particle filled epoxy resin and the fibrous build-up layer comprises a glass fiber reinforced epoxy resin.

19. The method of claim 14, wherein the CTE of the fibrous build-up layer is no more than half the CTE of the non-fibrous build-up layer.

20. The method of claim 14, wherein each of the build-up dielectric layers has a thickness that is substantially less than the thickness of the core layer.

\* \* \* \* \*